US008071920B2

(12) United States Patent
Shimanuki et al.

(10) Patent No.: US 8,071,920 B2
(45) Date of Patent: Dec. 6, 2011

(54) PLANAR HEATER (75) Inventors: Kazuhiko Shimanuki, Yamagata (JP); Daisuke Hayashi, Tokyo (JP)

(73) Assignees: Covalent Materials Corporation, Tokyo (JP); Tokyo Electron Limited, Tokyo (JP)

(*) Notice: Subject to any disclaimer, the term of this patent is extended or adjusted under 35 U.S.C. 154(b) by 597 days.

(21) Appl. No.: 12/270,094

(22) Filed: Nov. 13, 2008

(65) Prior Publication Data
US 2009/0159587 A1   Jun. 25, 2009

(30) Foreign Application Priority Data
Nov. 19, 2007   (JP) ................................. 2007-299326

(51) Int. Cl.
H05B 3/68 (2006.01)
H05B 3/08 (2006.01)

(52) U.S. Cl. .................. 219/443.1; 219/444.1; 219/541

(58) Field of Classification Search .... 219/443.1–468.2, 219/541–548; 174/59, 60; 118/724, 725
See application file for complete search history.

(56) References Cited

U.S. PATENT DOCUMENTS

| 5,462,603 A * | 10/1995 | Murakami ..................... 118/719 |
| 5,478,429 A * | 12/1995 | Komino et al. .......... 156/345.44 |
| 6,066,836 A * | 5/2000 | Chen et al. ..................... 219/390 |
| 6,204,488 B1 * | 3/2001 | Toya et al. ..................... 219/541 |
| 6,407,371 B1 * | 6/2002 | Toya et al. ..................... 219/553 |
| 6,584,279 B2 * | 6/2003 | Seko et al. ..................... 392/407 |
| 6,885,814 B2 * | 4/2005 | Saito et al. ..................... 392/407 |

FOREIGN PATENT DOCUMENTS
JP   2007-220595 A   8/2007
* cited by examiner Primary Examiner — Sang Paik
(74) Attorney, Agent, or Firm — Foley & Lardner LLP (57) ABSTRACT A planar heater 1 in which a power supply terminal unit 108 which supplies an electric power is arranged on a central portion on a lower surface of a silica glass plate-like member 102. The power supply terminal unit includes small-diameter silica glass tubes 105a and 106a, which contain a connection line which supplies an electric power to a carbon heat generator and a large-diameter silica glass tube 2 which contains the small-diameter silica glass tubes 105a and 106a. A flange portion 2a is formed on a lower end of the large-diameter silica glass tube 2, and a bent portion 2b having different diameters is formed between an upper end of the large-diameter silica glass and the flange portion 2a, and the first heat shielding plates 19, 20 and 21 configured by metal plates or opaque silica glass plates are contained in the large-diameter silica glass tube below the bent portion.

5 Claims, 10 Drawing Sheets

PLANAR HEATER

BACKGROUND OF THE INVENTION

1. Field of the Invention

The present invention relates to a planar heater, more particularly to a planar heater in which a carbon wire heat generator is sealed in a silica glass plate-like member, and to a planar heater preferably used in a heat treatment for a wafer in a semiconductor manufacturing process.

2. Description of the Related Art

In semiconductor manufacturing processes, various heat treatments are performed to a silica wafer and the like in the steps. These heat treatments require severe temperature management, and a heat treatment atmosphere is required to maintain clean atmosphere in which particles such as dust are not present.

For this reason, a heater used in a heat treatment requires good temperature uniformity and good temperature rising/dropping controllability, and needs to satisfy various conditions such as a condition that a contamination material such as particles are not emitted. As one of these semiconductor manufacturing heaters, a heater having a structure in which a heat generator and a non-oxide atmospheric gas are sealed in a supporting member such as a silica glass member is known.

The present inventors developed a semiconductor heat treatment apparatus heater as a very preferable semiconductor manufacturing heater in which a carbon wire heat generator fabricated by weaving a plurality of carbon fiber bundles each obtained by bundling extra fine carbon fibers is sealed in a supporting member such as a silica glass member together with a non-oxidizing atmospheric gas and have filed the heater as Japanese Patent Application Laid-Open No. 2007-220595.

Figure 9:
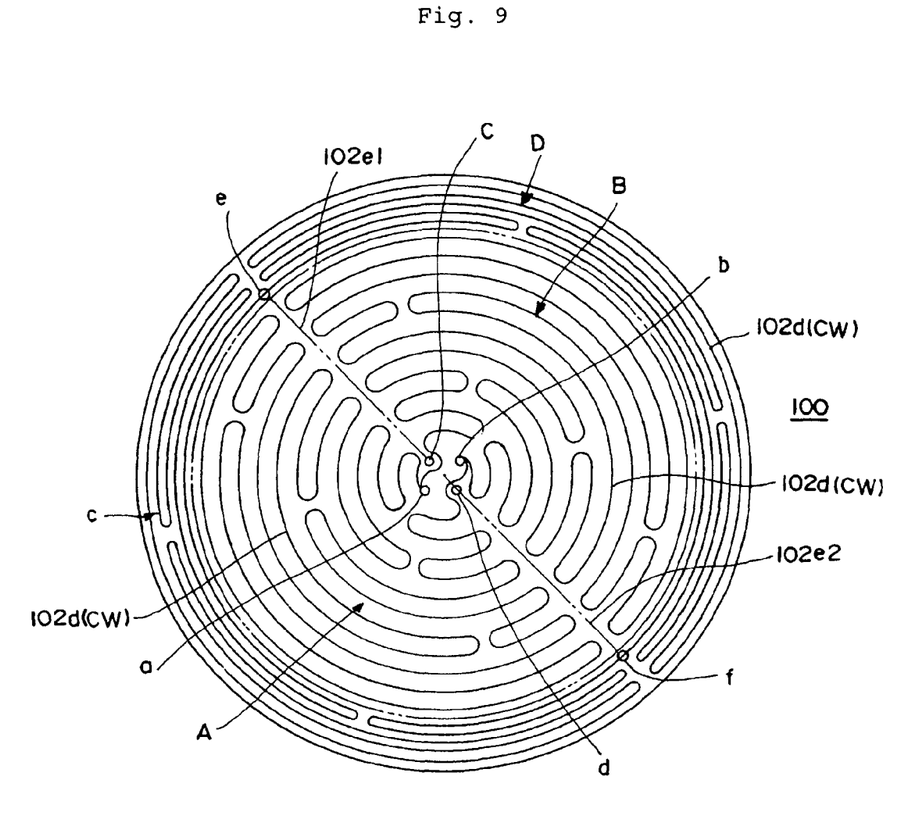
FIG. 9 is a plan view showing a planar heater.

The heater described in Patent Document 1 will be described below with reference to FIGS. 9 to 11. FIG. 9 is a plan view showing a planar heater, FIG. 10 is a side view of a planar heater shown in FIG. 9, and FIG. 11 is a sectional view along an I-I line in FIG. 10.

Figure 10:
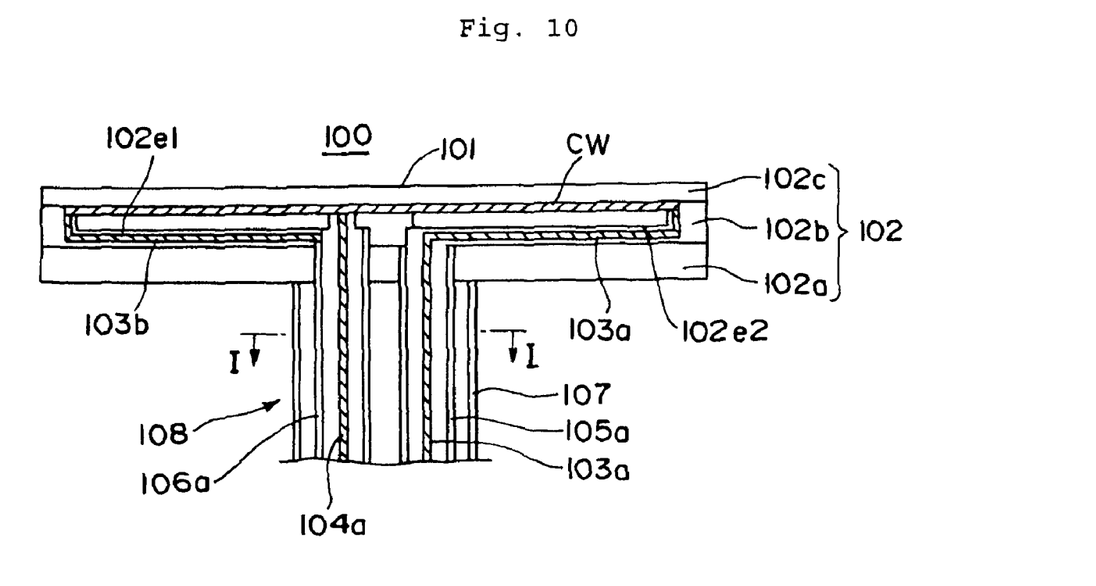
FIG. 10 is a side view of the planar heater shown in FIG. 9.
Figure 11:
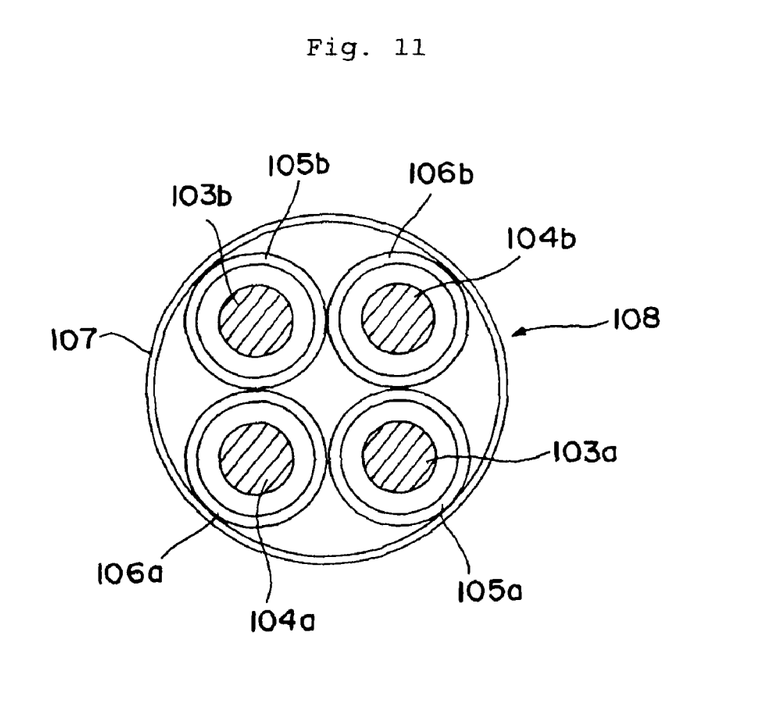
FIG. 11 is a sectional view along an I-I line in FIG. 10.

As shown in FIGS. 9 and 10, in a planar heater 100, a heating surface 101 is circular planarly formed, and a carbon wire heat generator CW is sealed in a silica glass plate-like member 102. The silica glass plate-like member 102 includes a first silica glass member 102a, a second silica glass member 102b, and a third silica glass member 102c.

The upper and lower surfaces of the first silica glass member 102a and the third silica glass member 102c are planarly formed. On the other hand, in the upper surface of the second silica glass member 102b, a trench 102d having the same shape as that of an arrangement pattern shown in FIG. 9 is formed. In the lower surface of the second silica glass member 102b, trenches 102e1 and 102e2 radially extending from the center are provided.

On the planar heater 100, as shown in FIG. 9, the heating surface 101 is divided into four regions A, B, C, and D. More specifically, a carbon wire heat generator CW is arranged in each of the regions A and B which are regions obtained by dividing an inside region of the heating surface 101 by two and furthermore, the regions C and D which are regions obtained by dividing an outside region positioned on the circumference of the inside region of the heating surface 101.

The trench 102d in the inside regions (region A and region B) of the heating surface 101 communicates with a through hole formed in positions a and b of the central portion on the heating surface 101. On the other hand, the trench 102d in the outside regions (region C and region D) of the heating surface 101 communicate with a through hole formed in outer circumferential positions e and f of a heating surface 101a.

One end of the trench 102e1 communicates with a through hole formed in a position c of the central portion on the heating surface 101, and the other end communicates with the through hole formed in the position e of the outer circumferential portion of the heating surface 101. Similarly, one end of the trench 102e2 communicates with a through hole formed in a position d of the central portion on the heating surface 101, and the other end communicates with the through hole formed in the position f of the outer circumferential portion of the heating surface 101.

The carbon wire heat generator CW is contained in the internal portion of the trench 102d in the inside regions (region A and region B) and the outside regions (region C and region D), a connection line 103b is contained in the trench 102e1, and a connection line 103a is contained in the trench 102e2.

Furthermore, at the lower central portion of a first silica glass member 2a, as shown in FIGS. 10 and 11, an electric power supply terminal unit 108 having connection lines 103a, 103b, 104a, and 104b energized to the carbon wire heat generator CW is arranged. The connection lines 103a and 103b are connection lines to energize the regions C and D of the outside regions, and the connection lines 104a and 104b are connection lines to energize the center portion side regions A and B.

As shown in FIGS. 10 and 11, the connection line 103a is contained in a silica glass tube 105a, and the connection line 103b is contained in a silica glass tube 105b. The silica glass tubes 105a and 105b which contain the connection lines 103a and 103b pass through the first silica glass member 102a to be brought into contact with the lower surface of the second silica glass member 102b.

Therefore, the connection line 103a enters the trench 102e2 from the silica glass tube 105a at the position d, and is connected to carbon wire heat generators CWC and CWD in the regions C and D of the outside regions through a through hole at the position f. Similarly, the connection line 103b enters the trench 102e1 from the silica glass tube 105b at the position c, and is connected to the carbon wire heat generator CW in the regions C and D of the outside regions through a through hole at the position e.

The connection line 104a is contained in silica glass tube 106a, and the connection line 104b is contained in a silica glass tube 106b. The silica glass tubes 106a and 106b pass through the first silica glass member 102a to be brought into contact with an internal portion bottom surface in which a through hole formed in the second silica glass member 102b opens. Therefore, the connection line 104a passes from the silica glass tube 106a through a through hole at the position a, and is connected to the carbon wire heat generator CW in the center portion side regions A and B. The connection line 104b passes from the silica glass tube 106b through a through hole at the position b, and is connected to the carbon wire heat generator CW in the center portion side regions A and B.

End portions of all the silica glass tubes 105a, 105b, 106a, and 106b which contain the connection lines 103a, 103b, 104a, and 104b are sealed and contained in the internal portion of a large-diameter silica glass tube 107.

In this manner, since the connection lines 103a, 103b, 104a, and 104b are concentrated on a central portion on a rear surface of the heating surface 101 and configured as the power supply terminal unit 108, a compact heat generator can be achieved. A heater obtained by sealing the heat generator in a clean heat-resistant support member such as a high-purity silica glass member together with a non-oxidizing gas does not generate particles or the like, and are very preferably used as a semiconductor manufacturing heater as described above.

In the meanwhile, Radiant heat from the carbon wire heat generator CW is propagated to not only the heating surface 101 of the planar heater but also to the lower side of the planar heater 100. In particular, a lower end portion of the large-diameter silica glass tube 107 is attached to a flange or the like of a casing through an O ring. For this reason, radiant heat from the carbon wire heat generator CW passes through the internal portion of the large-diameter silica glass tube 107, is propagated to the O ring, and deteriorates the O ring to pose a technical problem.

SUMMARY OF THE INVENTION

The present invention has been made to solve the above technical problem and has as its object to provide a planar heater that suppresses radiant heat from being propagated to a lower side of the planar heater and, in particular, has as its object to provide a planar heater that suppresses radiant heat passing through an internal portion of the large-diameter silica glass tube constituting a power supply terminal unit of the planar heater from being propagated.

In order to achieve the above object, according to the present invention, there is provided a planar heater in which a carbon wire heat generator is planarly arranged and sealed in the internal portion of a silica glass plate-like member and a power supply terminal unit which supplies an electric power to the carbon wire heat generator is planar heater arranged at a central portion on a lower surface of the silica glass plate-like member, wherein the power supply terminal unit includes a connection line which supplies an electric power to the carbon wire heat generator; a small-diameter silica glass tube which contains the connection line; and a large-diameter silica glass tube which contains the small-diameter silica glass tube and is attached to have an upper end portion being in contact with the lower surface of the heater, a flange portion is formed on a lower end portion of the large-diameter silica glass tube, and a bent portion having different diameters is formed between the upper end portion and the flange portion, and a first heat shielding plate configured by any of a metal plate, or an opaque silica glass plate, or a combination therebetween is contained in the large-diameter silica glass tube below the bent portion.

In this manner, since the bent portion having the different diameters is formed between the upper end portion and the flange portion of the large-diameter silica glass tube, radiant heat passing through the large-diameter silica glass tube can be suppressed from being propagated. Furthermore, since the first heat shielding plate configured by the metal plate or the opaque silica glass plate is contained in the large-diameter silica glass tube below the bent portion, radiant heat passing through the internal portion of the large-diameter silica glass tube can be suppressed from being propagated. As a result, an adverse effect such as deterioration of an O ring arranged below the planar heater can be prevented.

In particular, when at least one of the first heat shielding plate is a metal plate, radiant heat passing through the internal portion of the large-diameter silica glass tube can be more reliably suppressed from being propagated.

At this point, it is preferred that the first heat shielding plate includes a plurality of heat shielding plates, at least one of the heat shielding plates is configured by a metal plate, the second heat shielding plate includes a plurality of opaque silica glass plates and is contained in the large-diameter silica glass tube above the bent portion, and the first heat shielding plate and the second heat shielding plate are arranged in an axis line direction of the large-diameter silica glass tube.

It is desired that the second heat shielding plate configured by the opaque silica glass plate is contained in the large-diameter silica glass tube above the bent portion, a third heat shielding plate which covers an outside region of the power supply terminal unit on the lower surface side of the silica glass plate-like member is arranged, the third heat shielding plate is configured by a plurality of silica glass plates, and as in at least a heat shielding plate closest to the lower surface of the silica glass-like member, a carbon sheet is contained in a transparent silica glass plate.

In this manner, when the carbon sheet is contained in the transparent silica glass in the heat shielding plate closest to the lower surface of the silica glass plate-like member, radiant heat on the lower surface side of the silica glass plate-like member can be further suppressed.

In particular, in the third heat shielding plate closest to the lower surface of the silica glass plate-like member, the carbon sheet is contained in the transparent silica glass. When the second heat shielding plate is configured by a plurality of opaque silica glass plates, heat can be suppressed from being held in the central portion of the silica glass plate-like member, and temperature uniformity of the heating surface of the silica glass plate-like member can be improved.

The third heat shielding plates are desired, respectively, held by a holding member arranged on the lower surface of the silica glass plate-like member in parallel to the lower surface of the silica glass plate-like member.

Furthermore, it is desired that a recessed portion is formed in the middle portion on the lower surface of the silica glass plate-like member, and a cap member consisting of carbon is contained in the recessed portion, and furthermore, a thermocouple is contained in the cap member.

In this manner, since the thermocouple is contained in the cap member consisting of carbon, a temperature can be accurately measured.

According to the present invention, a planar heater which suppresses radiant heat from being propagated to a lower side of the planar heater can be obtained, and in particular, a planar heater which suppresses radiant heat passing through an internal portion of the large-diameter silica glass tube constituting a shaft portion of the planar heater from being propagated.

DESCRIPTION OF THE PREFERRED EMBODIMENTS

Figure 1:
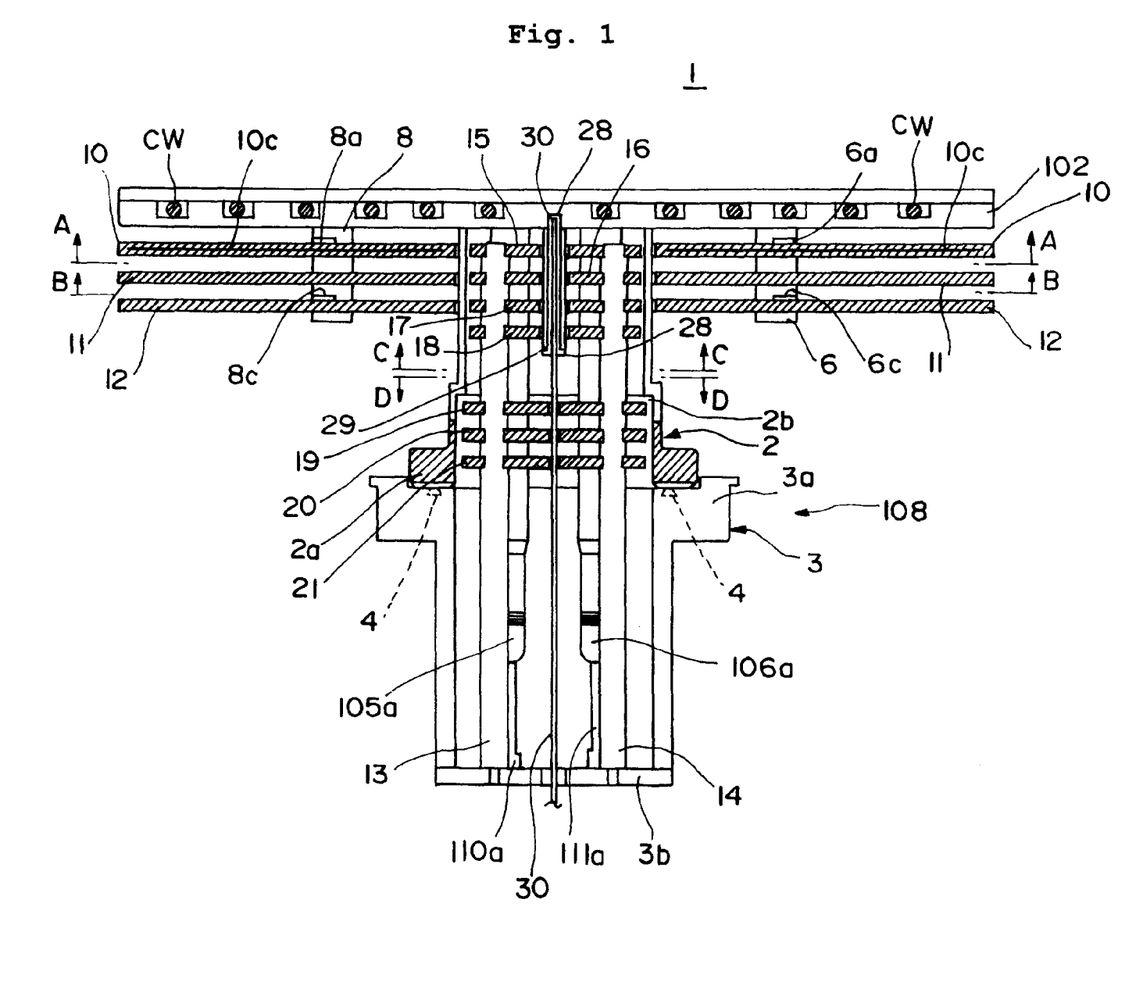
FIG. 1 is a plan view showing a planar heater according to an embodiment of the present invention.
Figure 2:
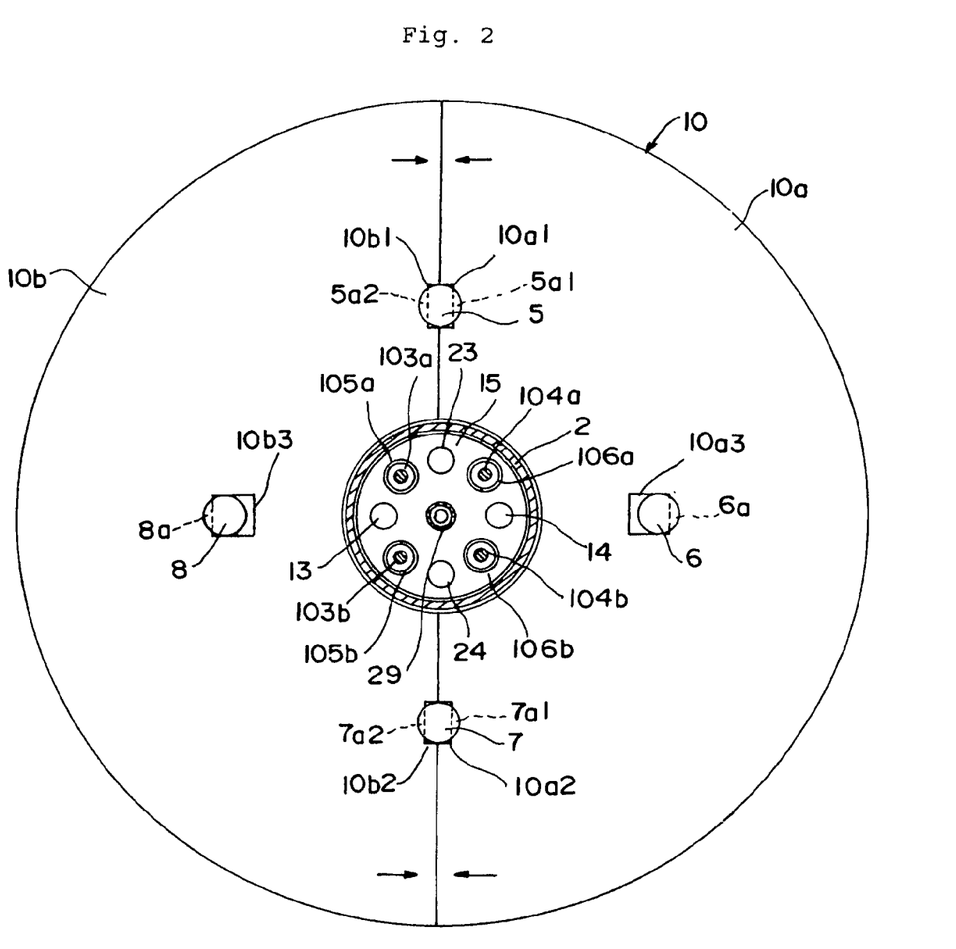
FIG. 2 is a sectional view along an A-A line in FIG. 1.
Figure 3:
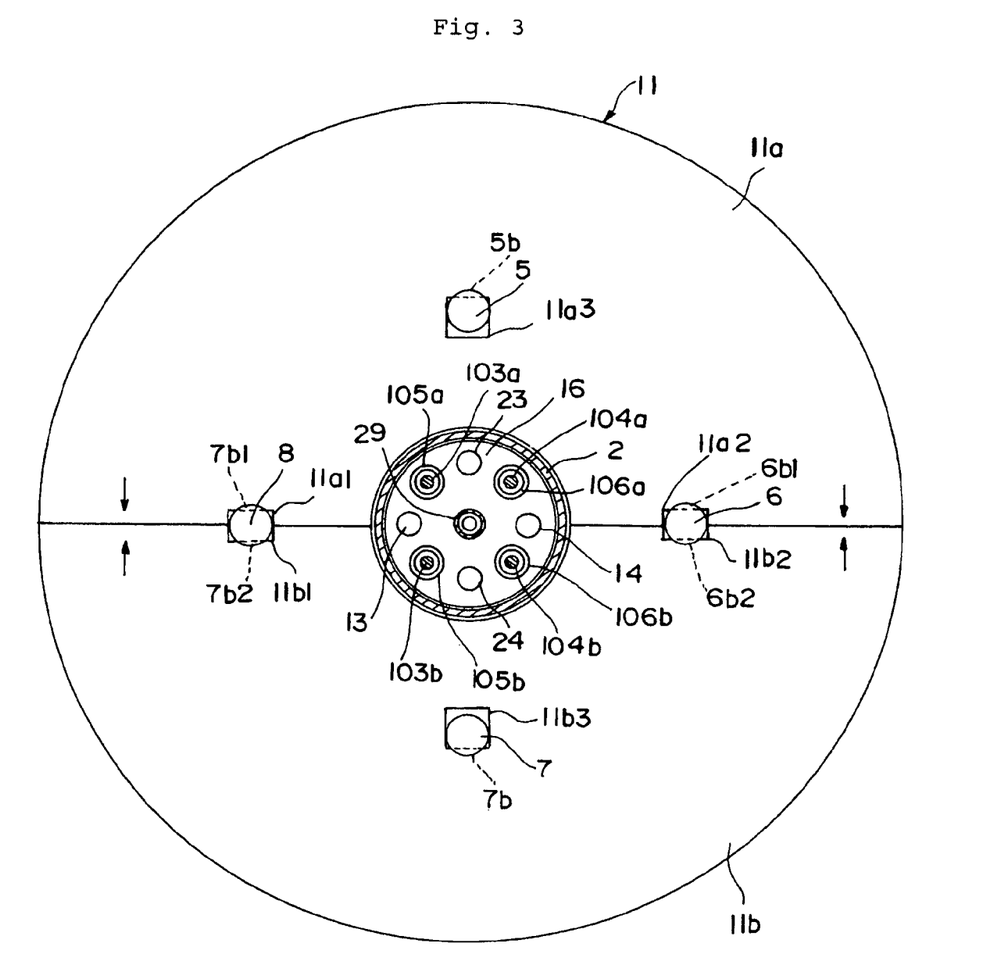
FIG. 3 is a sectional view along a B-B line in FIG. 1.
Figure 4:
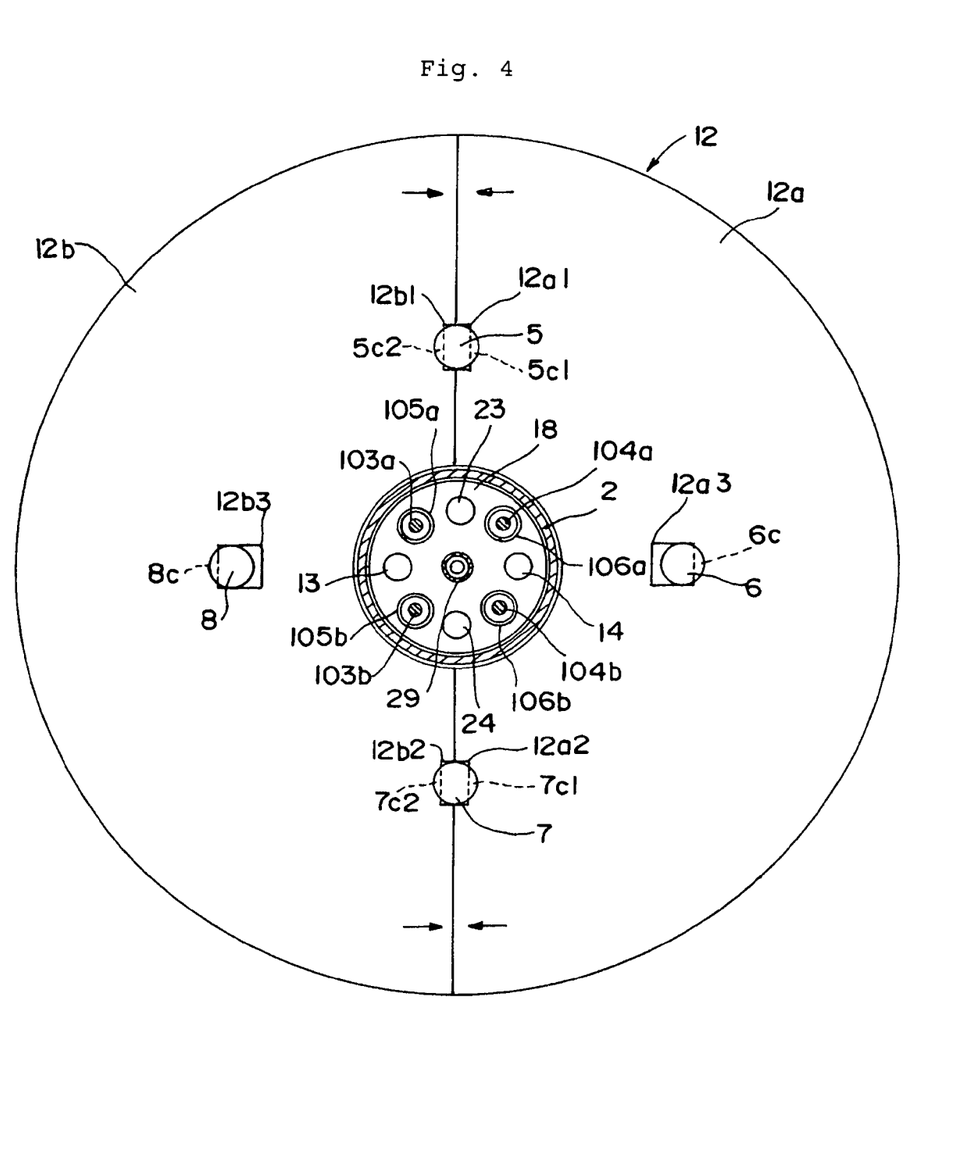
FIG. 4 is a sectional view along a C-C line in FIG. 1.
Figure 5:
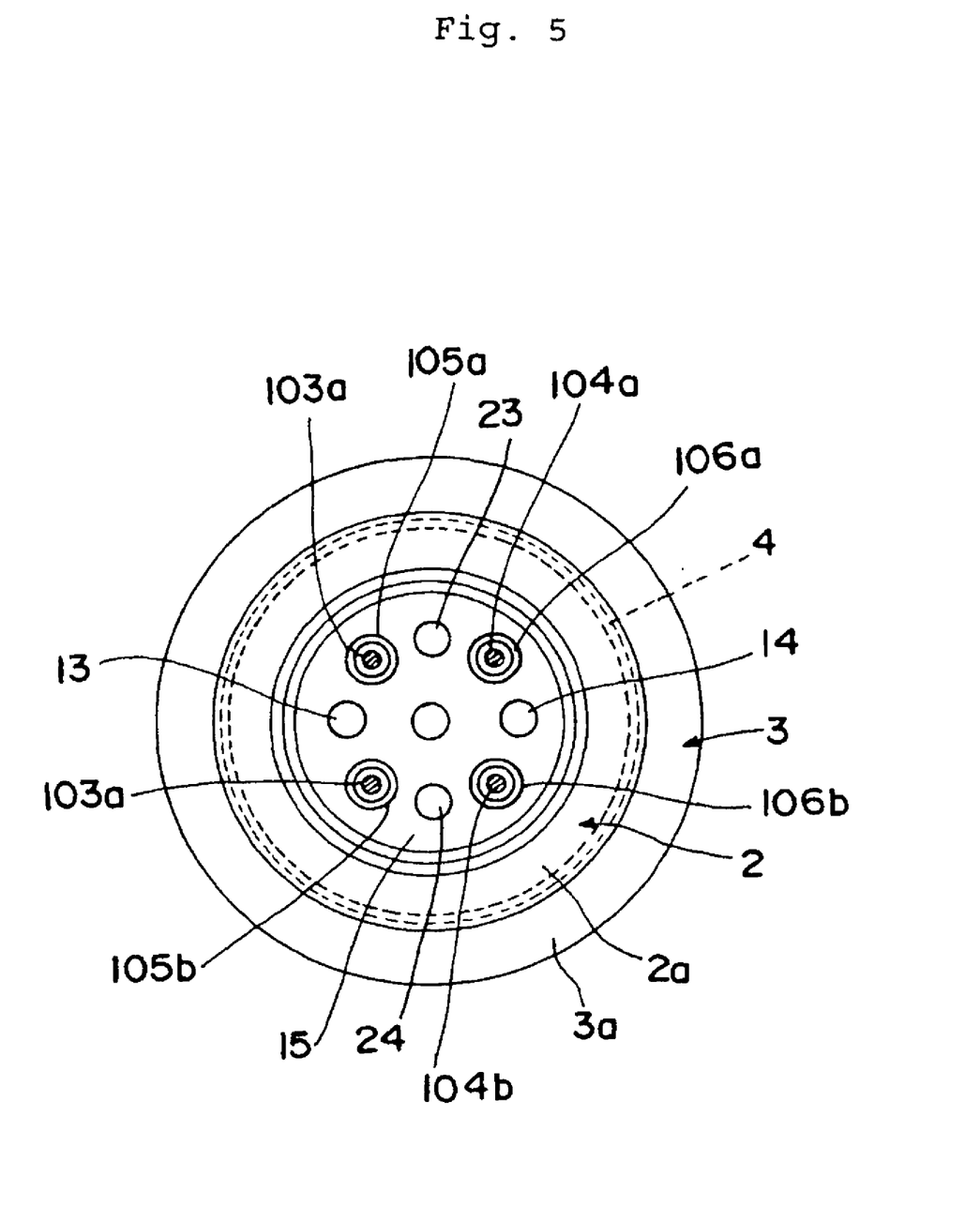
FIG. 5 is a sectional view along a D-D line in FIG. 1.
Figure 6:
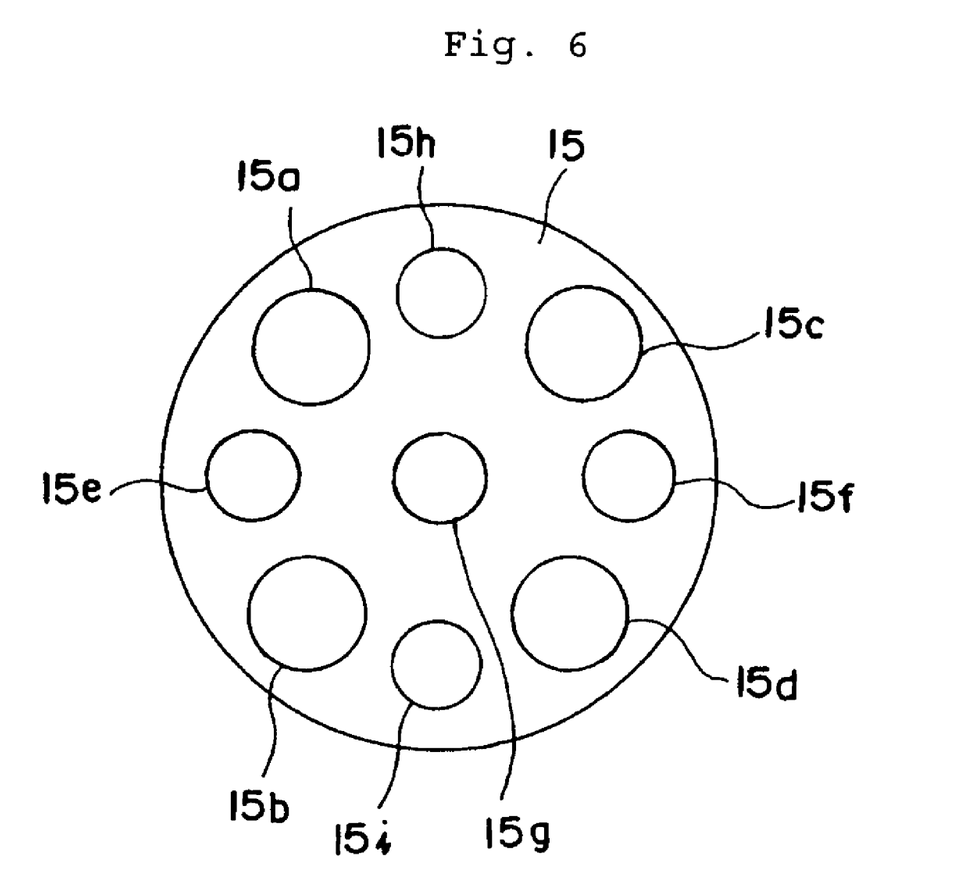
FIG. 6 is a plan view showing an upper heat shielding plate shown in FIG. 1.
Figure 7:
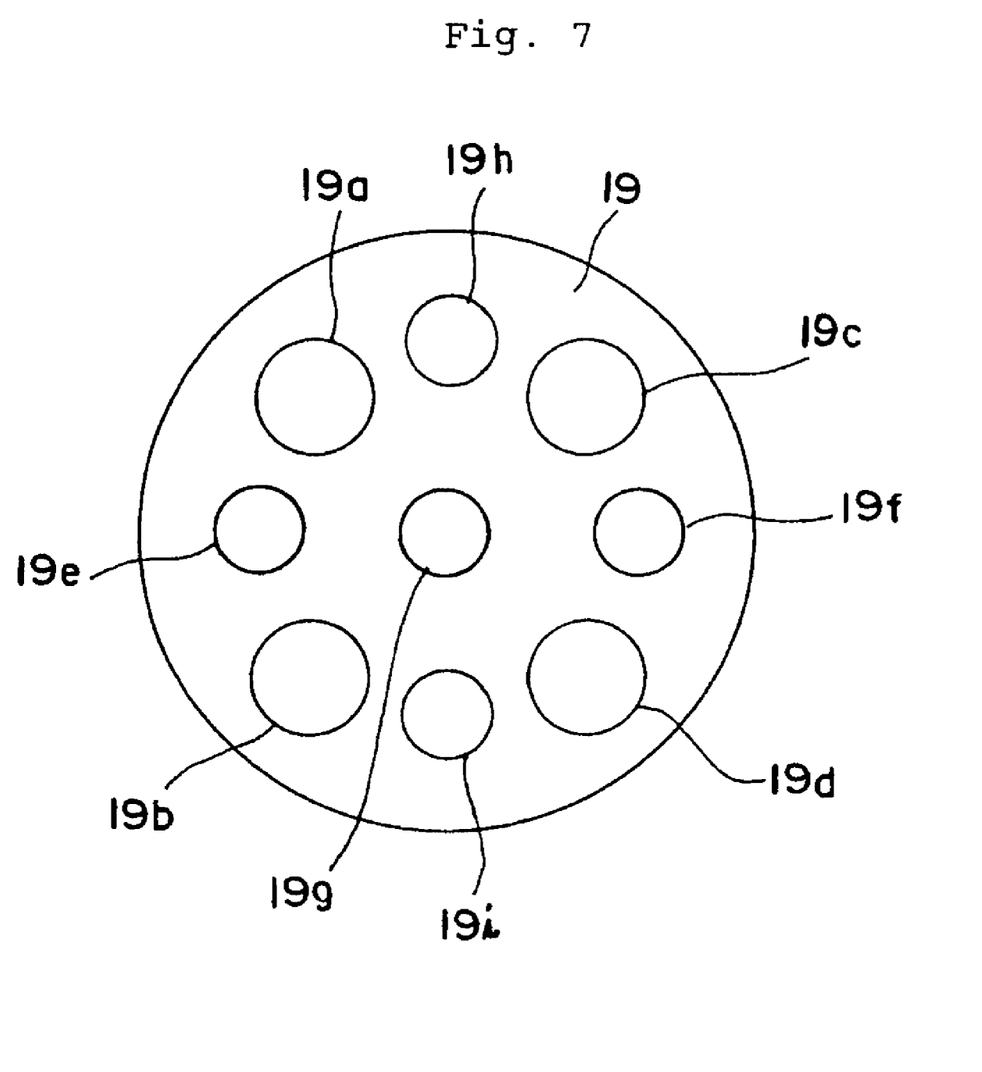
FIG. 7 is a plan view showing a lower heat shielding plate shown in FIG. 1.
Figure 8:
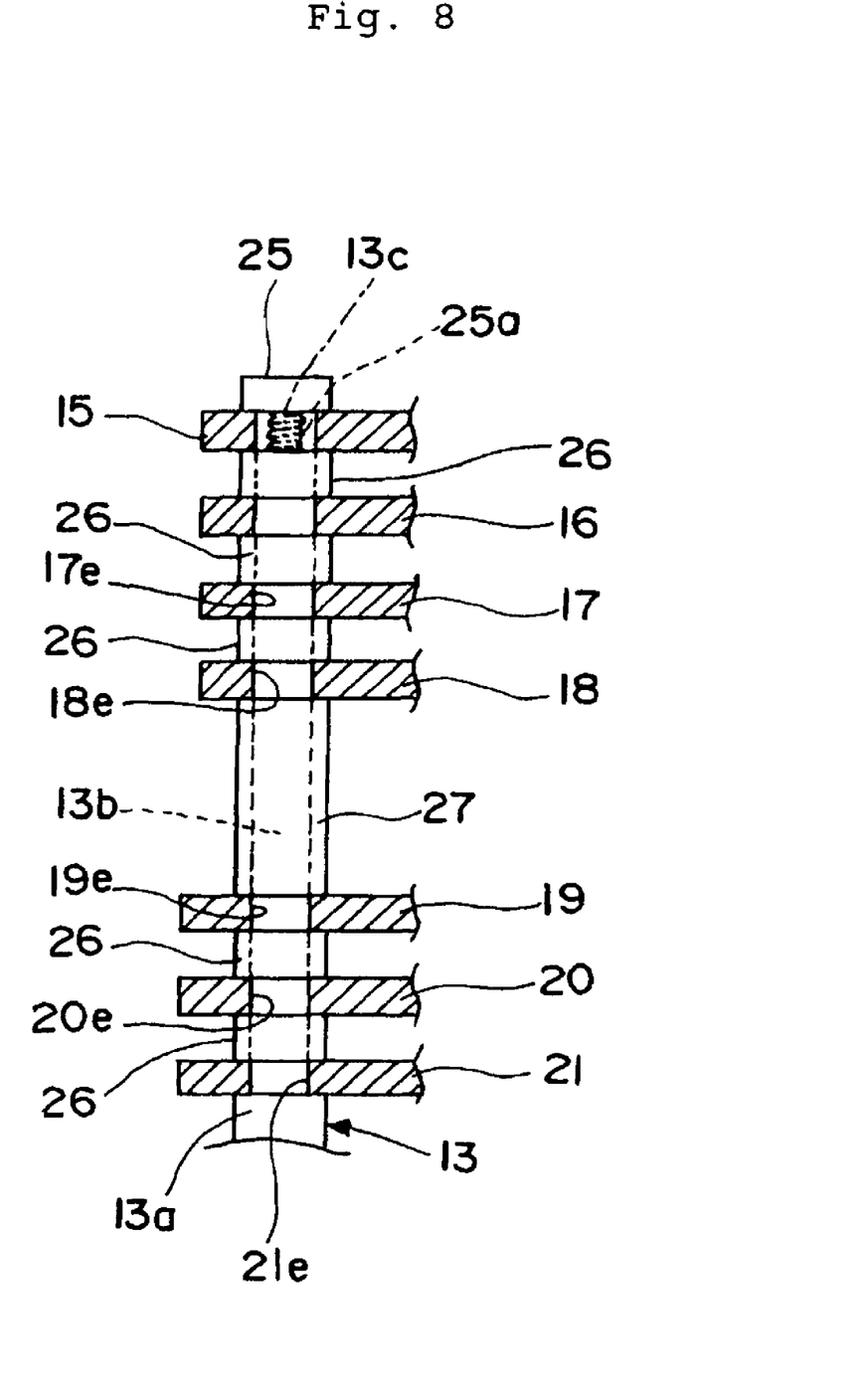
FIG. 8 is a side view showing assembling states the upper heat shielding plate and the lower heat shielding plate.

An embodiment of the present invention will be described below with reference to FIGS. 1 to 8. FIG. 1 is a sectional view showing a planar heater according to an embodiment of the present invention. FIG. 2 is a sectional view along an A-A line in FIG. 1. FIG. 3 is a sectional view along a B-B line in FIG. 1. FIG. 4 is a sectional view along a C-C line in FIG. 1. FIG. 5 is a sectional view along a D-D line in FIG. 1. FIG. 6 is a plan view showing an upper heat shielding plate shown in FIG. 1. FIG. 7 is a plan view showing a lower heat shielding plate shown in FIG. 1. FIG. 8 is a side view showing assembling states of the upper heat shielding plate and the lower heat shielding plate. The same reference numerals as in FIGS. 9 to 11 denote the same members as the members constituting the planar heater shown in FIGS. 9 to 11 or members corresponding to the members constituting the planar heater, and the detailed explanation of the members will be omitted.

As shown in FIG. 1, the planar heater 1 like the planar heater 100 shown in FIGS. 9 to 11, a carbon wire heat generator CW is concentrically sealed in a silica glass plate-like member 102 to extend from an in-plane central portion to a portion near the circumference to form a circular-plate-like heating surface 101.

Connection lines 103a, 103b, 104a, and 104b which are connected to the carbon wire heat generator CW in the silica glass plate-like member 102 to supply electric power to the carbon wire heat generator CW are contained in silica glass tubes 105a, 105b, 106a, and 106b. Ends of the silica glass tubes 105a, 105b, 106a, and 106b are sealed, and connection terminals 110a and 111a project from the end portions (connection terminals projecting from the silica glass tubes 105b and 106b are not shown).

The silica glass tubes 105a, 105b, 106a, and 106b are contained in a large-diameter silica glass tube 2 attached to the lower surface of the silica glass plate-like member 102. The large-diameter silica glass tube 2 functions as a shaft portion (power supply terminal unit) to attach the planar heater. A flange 2a is formed at the lower end portion of the large-diameter silica glass tube 2.

The flange 2a is attached to a flange 3a of a casing 3 which closes an open end portion of the large-diameter silica glass tube 2 through an O ring 4. The flange 2a consists of opaque silica glass. The flange 2a is formed to have a thickness larger than that of a cylindrical portion of the silica glass tube 2 to suppress radiant heat from being propagated to the flange 3a of the casing 3.

An upper end portion of the silica glass tube 2 is attached to a lower surface of the silica glass plate-like member 102. A bent portion 2b having different diameters of the silica glass tube are formed between the upper end portion of the silica glass tube 2 and the flange 2a. More specifically, the diameter of the silica glass tube 2 at a portion from the bent portion 2b to the lower-side portion is formed to be larger than that of the upper-side portion of the bent portion 2b.

In this manner, when the bent portion 2b is not formed in the silica glass tube 2, radiant heat from the lower surface of the silica glass plate-like member 102 passes through the silica glass tube 2 and propagates to the flange 3a of the casing 3. In contrast to this, when the bent portion 2b is formed in the silica glass tube 2, the radiant heat is shielded by the bent portion 2a. For this reason, radiant heat is suppressed from being propagated.

As shown in FIGS. 1 to 4, cylindrical holding members 5, 6, 7, and 8 to hold third heat shielding plates 10, 11, and 12 are arranged on a lower surface of the heater portion (silica glass plate-like member 102). Three stages of the slit portions obtained in up-and-down direction by cutting from the circumferential surface in an axis line direction are perpendicularly formed in the holding members 5, 6, 7, and 8. The heat shielding plates 10, 11, and 12 are designed to be placed on shelf portions formed by the slit portions.

To be described more specifically, as shown in FIG. 2, the first stage of the heat shielding plate 10 is configured by heat shielding plates 10a and 10b which are divided into two half-ring shapes. The heat shielding plates 10a and 10b are transparent silica glass members which contain a carbon sheet 10c (including graphite sheet) in the internal portion of transparent silica glass member.

Notches 10a1, 10a2, 10b1, and 10b2 are formed in both side portions of linear radial portions of heat shielding plates 10a and 10b. Through holes 10a3 and 10b3 through which the holding members 6 and 8 pass are formed at positions shifted from the notches 10a1, 10a2, 10b1, and 10b2 by 90° in the heat shielding plates 10a and 10b.

In order to attach the heat shielding plates 10a and 10b to the holding members 5, 6, 7, and 8, the holding members 6 and 8 are inserted into the through holes 10a3 and 10b3 of the heat shielding plates 10a and 10b, the heat shielding plates 10a and 10b are moved in an arrow direction shown in FIG. 2, and radial portions (edge portions of the notches 10a1, 10a2, 10b1, and 10b2) of the heat shielding plates 10a and 10b are placed on shelf portions of slit portions 5a1, 5a2, 7a1, and 7a2 of the holding members 5 and 7. The edge portions of the through holes 10a3 and 10b3 of the heat shielding plates 10a and 10b are placed on the shelf portions of slit portions 6a and 8a of the holding members 6 and 8.

At this time, since the notches 10a1, 10a2, 10b1, and 10b2 are formed, the radial portions of the heat shielding plates 10a and 10b are brought into contact with each other without forming a gap therebetween. The heat shielding plates 10a and 10b are attached as if one heat shielding plate is held by the holding members 5, 6, 7, and 8.

Since the edge portions of the notches 10a1, 10a2, 10b1, and 10b2 and the edge portions of the through holes 10a3 and 10b3 are engaged with circumferential surfaces of the holding members 5, 6, 7, and 8, the heat shielding plates 10a and 10b can be moved in only an opposing direction of the arrow shown in FIG. 2. When the heat shielding plates 10a and 10b are to be removed, the heat shielding plates 10a and 10b are moved in the opposing direction of the arrow shown in FIG. 2.

As shown in FIG. 3, the second stage of the heat shielding plate 11, like the heat shielding plate 10, is configured by heat shielding plates 11a and 11b which are divided into two half-ring shapes. The heat shielding plates 11a and 11b are opaque silica glass members. In consideration of a heat shielding function, like the first stage of the heat shielding plate, the heat shielding plates 11a and 11b may be transparent silica glass members in which a carbon sheet is contained in the internal portion of the heat shielding plates 11a and 11b (transparent silica glass members).

Notches 11a1, 11a2, 11b1, and 11b2 are formed in both side portions of linear radial portions of the heat shielding plates 11a and 11b. Through holes 11a3 and 11b3 through which the holding members 5 and 7 pass are formed in the heat shielding plates 11a and 11b.

In order to attach the heat shielding plates 11a and 11b to the holding members 5, 6, 7, and 8, the holding members 5 and 7 are inserted into the through holes 11a3 and 11b3 of the heat shielding plates 11a and 11b, the heat shielding plates 11a and 11b are moved in an arrow direction shown in FIG. 3, and radial portions (edge portions of the notches 11a1, 11a2, 11b1, and 11b2) of the heat shielding plates 11a and 11b are placed on shelf portions of slit portions 6b1, 6b2, 7b1, and 7b2 of the holding members 6 and 8.

The edge portions of the through holes 11a3 and 11b3 of the heat shielding plates 11a and 11b are placed on the shelf portions of the slit portion 5b and 7b of the holding members 5 and 7.

Like the heat shielding plates 10a and 10b, since the notches 11a1, 11a2, 11b1, and 11b2 are formed in the heat shielding plates 11a and 11b, the radial portions of the heat shielding plates 11a and 11b are brought into contact with each other without forming a gap therebetween. The heat shielding plates 11a and 11b are attached as if one heat shielding plate is held by the holding members 5, 6, 7, and 8.

Since the edge portions of the notches 11a1, 11a2, 11b1, and 11b2 and the edge portions of the through holes 11a3 and 11b3 are engaged with circumferential surfaces of the holding members 5, 6, 7, and 8, the heat shielding plates can be moved in only an opposing direction of the arrow shown in FIG. 3. When the heat shielding plates 11a and 11b are to be removed, the heat shielding plates 11a and 11b are moved in the opposing direction of the arrow shown in FIG. 3.

As described above, the heat shielding plates 11a and 11b are moved from a direction shifted from the moving direction of the first stage of the heat shielding plates 10a and 10b by 90° and attached to the holding members 5, 6, 7, and 8. More specifically, the notches 10a1, 10a2, 10b1, and 10b2 of the heat shielding plates 10a and 10b are placed on the first stage of the holding members 5 and 7. The edge portions of the through holes 11a3 and 11b3 of the heat shielding plates 11a and 11b are placed on the second stage of the holding members 5 and 7.

Similarly, the through holes 10a3 and 10b3 of the heat shielding plates 10a and 10b are placed on the first stage of the holding members 6 and 8. The edge portions of the notches 11a1, 11a2, 11b1, and 11b2 of the heat shielding plates 11a and 11b are placed on the second stage of the holding members 6 and 8.

Furthermore, as shown in FIG. 4, like the heat shielding plate 10, the third stage of the heat shielding plate 12 is configured by heat shielding plates 12a and 12b which are divided into two half-ring shapes. The heat shielding plates 12a and 12b are opaque silica glass members. In consideration of a heat shielding function, transparent silica glass members in which a carbon sheet is contained in the internal portion of the heat shielding plates 12a and 12b (transparent silica glass members) may be used.

Notches 12a1, 12a2, 12b1, and 12b2 are formed in both side portions of linear radial portions of the heat shielding plates 12a and 12b. Through holes 12a3 and 12b3 through which the holding members 6 and 8 pass are formed in the heat shielding plates 12a and 12b.

In order to attach the heat shielding plates 12a and 12b to the holding members 5, 6, 7, and 8, the holding members 6 and 8 are inserted into the through holes 12a3 and 12b3 of the heat shielding plates 12a and 12b, the heat shielding plates 12a and 12b are moved in an arrow direction shown in FIG. 4, and radial portions (edge portions of the notches 12a1, 12a2, 12b1, and 12b2) of the heat shielding plates 12a and 12b are placed on shelf portions of slit portions 5c1, 5c2, 7c1, and 7c2 of the holding members 5 and 7.

The edge portions of the through holes 12a3 and 12b3 of the heat shielding plates 12a and 12b are placed on the shelf portions of the slit portions 6c and 8c the holding members 6 and 8.

In this manner, when the third stage of the heat shielding plates 12a and 12b are moved in the same direction as the moving direction of the first stage of the heat shielding plates 10a and 10b, the heat shielding plates 12a and 12b are placed on the holding members 5, 6, 7, and 8.

Like the heat shielding plates 10a and 10b, since the notches 12a1, 12a2, 12b1, and 12b2 are formed in the heat shielding plates 12a and 12b, the radial portions of the heat shielding plates 12a and 12b are brought into contact with each other without forming a gap therebetween. The heat shielding plates 12a and 12b are attached as if one heat shielding plate is held by the holding members 5, 6, 7, and 8.

As described above, the heat shielding plates 12a and 12b are moved from a direction (the same direction as the moving direction of the first stage of the heat shielding plates 10a and 10b) shifted from the moving direction of the second stage of the heat shielding plates 11a and 11b by 90° and attached to the holding members 5, 6, 7, and 8. In this manner, heat shielding property to the lower side of the planar heater can be improved.

Furthermore, upper heat shielding plates 15, 16, 17, and 18 and lower heat shielding plates 19, 20, and 21 are contained in the internal portion of the large-diameter silica glass tube 2. The upper heat shielding plates 15, 16, 17, and 18 and the lower heat shielding plates 19, 20, and 21 are attached to holding bars 13, 14, 23, and 24 uprightly arranged on a lower end plate 3c of the casing 3.

Since the upper heat shielding plates 15, 16, 17, and 18 have the same configurations, the upper heat shielding plate 15 will be described below with reference to FIG. 6.

The upper heat shielding plate 15 consists of opaque silica glass and is formed in a circular-plate-like shape. In the upper heat shielding plate 15, through holes 15a, 15b, 15c, and 15d through which the silica glass tubes 105a, 105b, 106a, and 106b pass are formed, and through holes 15e, 15f, 15h, and 15i through which the holding bars 13, 14, 23, and 24 pass are formed. At the central portion on the upper heat shielding plate 15, a through hole 15g through which a protecting cylinder 29 which contains a thermocouple (will be described later) is formed.

The upper heat shielding plate 15 is contained in the silica glass tube 2 with a small gap between the circumferential portion of the upper heat shielding plate 15 and the inner wall of the silica glass tube 2.

The gap is formed to prevent the upper heat shielding plate 15 from being brought into contact with the inner wall of the large-diameter silica glass tube 2 in thermal expansion not to damage the large-diameter silica glass tube 2 or the upper heat shielding plate 15.

Since the lower heat shielding plates 19, 20, and 21 have the same configurations, the lower heat shielding plate 19 will be described below with reference to FIG. 7.

The lower heat shielding plate 19 consists of a metal and is formed in a circular-plate-like shape. In the upper heat shielding plate 19, through holes 19a, 19b, 19c, and 19d through which the silica glass tubes 105a, 105b, 106a, and 106b pass are formed, and through holes 19e, 19f, 19h, and 19i through which the holding bars 13, 14, 23, and 24 pass are formed. At the central portion on the upper heat shielding plate 19, a through hole 19g through which a protecting cylinder 29 which contains a thermocouple (will be described later) is formed.

The lower heat shielding plates 19, 20, and 21 are formed with diameters larger than those of the upper heat shielding plates 15, 16, 17, and 18, and small gaps are formed between the circumferential portions of the lower heat shielding plates 19, 20, and 21 and the inner wall of the silica glass tube 2.

The gaps are formed to prevent the lower heat shielding plates 19, 20, and 21 from being brought into contact with the inner wall of the large-diameter silica glass tube 2 in thermal expansion not to damage the large-diameter silica glass tube 2 or the lower heat shielding plates 19, 20, and 21.

In this case, in order to prevent heat from being held and to improve the temperature uniformity of the heating surface, when the upper heat shielding plate 15 and the silica glass plate-like member 102 are circular plates, the diameters of the upper heat shielding plates 15, 16, 17, and 18 are desired 14% to 24% of the diameter of the silica glass plate-like member 102.

As an example, the diameter of the silica glass plate-like member 102 can be set to 350 mm, and the diameters of the upper heat shielding plates 15, 16, 17, and 18 can be set to 68 mm. At this time, the inner diameter of the silica glass tube 2 is set to 70 mm, and the outer diameter thereof is set to 76 mm. For reference, the diameter of the through hole 15g (through hole through which the protecting cylinder 29 which contains thermocouples formed on the upper heat shielding plates 16, 17, and 18 pass) is set to 11.5 mm. The inner diameter of a large-diameter portion below the bent portion of the large-diameter silica glass tube 2 is set to 78 mm, and the outer diameter thereof is set to 84 mm. The diameters of the lower heat shielding plates 19, 20, and 21 are set to 77 mm. Furthermore, the diameter of the through hole 19g (through hole through which the protecting cylinder 29 which contains the thermocouples formed on the lower heat shielding plates 20 and 21 pass) is set to 6 mm, and is formed smaller than the diameter of the through hole 15g (through hole through which the protecting cylinder 29 which contains the thermocouples formed on the upper heat shielding plates 16, 17, and 18 pass). The flange 2a of the large-diameter silica glass tube 2 is formed to have an outer diameter of 112 mm.

Attaching operations of the upper heat shielding plates 15, 16, 17, and 18 and the lower heat shielding plates 19, 20, and 21 to the holding bars 13, 14, 23, and 24 will be described below with reference to FIG. 8. Since the attaching operations to the holding bars 13, 14, 23, and 24 are the same operations, the attaching operation to the holding bar 13 will be exemplified.

As shown in FIG. 8, the holding bar 13 includes a large-diameter base portion 13a and a small-diameter holding portion 13b formed on the distal end of the holding bar 13. A female screw portion is formed at the top of the holding portion 13b and configured to be screwed with a male thread portion 25a formed on a cap portion 25 (will be described later).

In order to attach the upper heat shielding plates 15, 16, 17, and 18 and the lower heat shielding plates 19, 20, and 21 to the holding bar 13, the holding portion 13b is inserted into a through hole 21e of the lower heat shielding plate 21 first, the lower heat shielding plate 21 is placed on the upper surface of the large-diameter base portion 13a.

Thereafter, the holding portion 13b is inserted into a ring member 26. The ring member 26 consists of silica glass and formed in a cylindrical shape. The ring member 26 is formed to have an outer diameter dimension equal to the diameter of the base portion 13a and to have such an inner diameter dimension that the holding portion 13b is inserted into the ring member 26.

Subsequently, the holding portion 13b is inserted into a through hole 20e of the lower heat shielding plate 20, and the lower heat shielding plate 20 is placed on the upper surface of the ring member 26. Thereafter, the holding portion 13b is inserted into the ring member 26. In this manner, the lower heat shielding plates 21, 20, and 19 and the ring members 26, 26 are stacked on the holding portion 13b of the holding bar 13.

After the lower heat shielding plate 19 is placed, the holding portion 13b is inserted into a long ring member 27. Thereafter, the holding portion 13b is inserted into a through hole 18e of the upper heat shielding plates 18, and the upper heat shielding plate 18 is placed on the upper surface of the long ring member 27. Furthermore, the ring member 26 is inserted into the holding portion 13b. Subsequently, the holding portion 13b is inserted into a through hole 17e of the upper heat shielding plate 17. The heat shielding plate 17 is placed on the upper surface of the ring member 26.

In this manner, the upper heat shielding plates 18, 17, 16, and 15 and the ring members 26, 26, 26 are stacked on the holding portion 13b of the holding bar 13.

Finally, the male thread portion 25a of the cap portion 25 is screwed with a female screw portion 13c formed in the top of the holding portion 13b to prevent the upper heat shielding plates 15, 16, 17, and 18 and the lower heat shielding plates 19, 20, and 21 from dropping from the holding portion 13b.

Furthermore, as shown in FIG. 1, a recessed portion 102A is formed on the central portion on the lower surface of the heater unit, and a cap member 28 consisting of carbon is attached to the recessed portion 102A. The cap member 28 is formed to have a cylindrical shape having a closed ceiling portion.

One end of the protecting cylinder 29 configured by a silica glass tube is attached to the lower surface of the heater which envelopes the recessed portion 102A. More specifically, an axis line of the protecting cylinder 29 is arranged on a center line of the recessed portion 102A. The through holes 15g, 16g, 17g, and 18g of the upper heat shielding plates 15, 16, 17, and 18 pass through the protecting cylinder 29. A thermocouple 30 is inserted in the internal portion of the cap member 28, so that a connection line 31 of the thermocouple 30 can pass through the internal portion of the protecting cylinder 29.

In this manner, since the thermocouple 30 is contained in the internal portion of the cap member 28, heat from the heat generator can be rapidly transmitted, radiation can be efficiently absorbed, and the temperature can be accurately measured.

In the planar heater having the above configuration, third heat shielding plates 10, 11, and 12 are arranged on the rear surface side of the heating surface 101, and the upper heat shielding plates 15, 16, 17, and 18 and the lower heat shielding plates 19, 20, and 21 are arranged in the internal portion of the large-diameter silica glass tube constituting the power supply terminal unit 108. For this reason, radiation of the heat of the rear surface direction (casing) of the heating surface 101 can be suppressed. As a result, an in-plane temperature of the heating surface can be more uniformly maintained, and an in-plane temperature of an object to be processed can be uniformed.

In particular, since the large-diameter silica glass tube 2 forming the power supply terminal unit 108 in the bent portion 2b, radiant heat passing through the internal portion of the large-diameter silica glass tube 2 can be suppressed from being propagated. Since the flange portion 2a of the large-diameter silica glass tube 2 is made thick, heat propagated to the casing can be suppressed.

As a result, thermal degradation of the O ring arranged between the flange portion 2a of the large-diameter silica glass tube 2 and the flange 3a of the casing 3 can be suppressed.

In a planar heater according to the present invention, an in-plane temperature of a heating surface can be uniformly maintained, and an in-plane temperature of an object to be processed can be uniformed. In particular, the planar heater can be preferably used in a heat treatment for a wafer or the like in a semiconductor manufacturing process.

This application claims priority from Japanese Patent Application 2007-299326, filed Nov. 19, 2007, which is incorporated herein by reference in its entirety.

What is claimed is:

1. A planar heater in which a carbon wire heat generator is planarly arranged and sealed in the internal portion of a silica glass plate-like member and a power supply terminal unit which supplies an electric power to the carbon wire heat generator is arranged at a central portion on a lower surface of the silica glass plate-like member, wherein the power supply terminal unit comprises a connection line which supplies an electric power to the carbon wire heat generator; a small-diameter silica glass tube which contains the connection line; and a large-diameter silica glass tube which contains the small-diameter silica glass tube and is attached to have an upper end portion being in contact with the lower surface of the heater, a flange portion is formed on a lower end portion of the large-diameter silica glass tube, and a bent portion having different diameters is formed between the upper end portion and the flange portion, and a first heat shielding plate configured by any one of a metal plate, or an opaque silica glass plate, or a combination therebetween is contained in the large-diameter silica glass tube below the bent portion.

2. The planar heater according to claim 1, wherein the first heat shielding plate includes a plurality of heat shielding plates, at least one of the heat shielding plates being configured by a metal plate, the second heat shielding plate includes a plurality of opaque silica glass plates and is contained in the large-diameter silica glass tube above the bent portion, and the first heat shielding plate and the second heat shielding plate are arranged in an axis line direction of the large-diameter silica glass tube.

3. The planar heater according to claim 1, wherein the second heat shielding plate configured by an opaque silica glass plate is contained in the large-diameter silica glass tube above the bent portion, a third heat shielding plate which covers an outside region of the power supply terminal unit is arranged on the lower surface side of the silica glass plate-like member, the third heat shielding plate includes a plurality of silica glass plates, and a carbon sheet is contained in a transparent silica glass in a heat shielding plate closest to the lower surface of at least the silica glass plate-like member.

4. The planar heater according to claim 3, wherein the third heat shielding plates are respectively held by a holding member arranged on a lower surface of the silica glass plate-like member in parallel to the lower surface of the silica glass plate-like member.

5. The planar heater according to claim 1, wherein a recessed portion is formed in the central portion on the lower surface of the silica glass plate-like member, and a cap member consisting of carbon is contained in the recessed portion, and a thermocouple is contained in the cap member.

* * * * *